United States Patent
Chen

(10) Patent No.: US 9,250,292 B2
(45) Date of Patent: Feb. 2, 2016

(54) TESTING SYSTEM FOR TESTING SEMICONDUCTOR PACKAGE STACKING CHIPS AND SEMICONDUCTOR AUTOMATIC TESTER THEREOF

(71) Applicant: CHROMA ATE INC., Taoyuan County (TW)

(72) Inventor: Chien-Ming Chen, Taoyuan (TW)

(73) Assignee: CHROMA ATE INC., Taoyuan County (TW)

(*) Notice: Subject to any disclaimer, the term of this patent is extended or adjusted under 35 U.S.C. 154(b) by 137 days.

(21) Appl. No.: 13/854,372

(22) Filed: Apr. 1, 2013

(65) Prior Publication Data

US 2013/0293252 A1 Nov. 7, 2013

(30) Foreign Application Priority Data

May 3, 2012 (TW) .............................. 101115834 A

(51) Int. Cl.
*G01R 31/28* (2006.01)

(52) U.S. Cl.
CPC ........ *G01R 31/2896* (2013.01); *G01R 31/2887* (2013.01)

(58) Field of Classification Search
CPC ........... G01R 31/2887; G01R 31/2886; G01R 31/2851; G01R 31/2896; G01R 31/2889; G01R 31/2891; G01R 31/2893; G01R 31/2853; G01R 31/2865; G01R 31/2867; G01R 31/2868; G01R 31/2879
USPC ........................................ 324/750.16–750.25
See application file for complete search history.

(56) References Cited

U.S. PATENT DOCUMENTS

| | | | | |
|---|---|---|---|---|
| 5,894,217 A * | 4/1999 | Igarashi et al. | ........... | 324/750.25 |
| 6,069,483 A * | 5/2000 | Maxwell et al. | ......... | 324/750.09 |
| 6,184,675 B1 * | 2/2001 | Bannai | ..................... | 324/750.03 |
| 6,590,383 B2 * | 7/2003 | Yamashita | ............. | G01R 31/01 324/750.19 |
| 2005/0030007 A1* | 2/2005 | Sakata | ........................ | 324/158.1 |
| 2007/0200555 A1* | 8/2007 | Mizushima et al. | ....... | 324/158.1 |
| 2010/0104404 A1* | 4/2010 | Yokoo | ................ | G01R 31/2893 414/226.01 |
| 2011/0193585 A1* | 8/2011 | Co | .................... | G11C 29/56016 324/756.02 |

* cited by examiner

*Primary Examiner* — Tung X Nguyen
*Assistant Examiner* — David Frederiksen
(74) *Attorney, Agent, or Firm* — Locke Lord LLP; Tim Tingkang Xia, Esq.

(57) ABSTRACT

A testing system for testing semiconductor package stacking chips is disclosed. The system includes a testing socket, a testing arm, and a testing mechanism. The testing mechanism includes a probe testing device. The probe testing device has a testing chip inside and a plurality of testing probes electrically connected to the testing chip. The plurality of testing probes extends toward the testing socket for contacting a chip-under-test loaded on the testing socket. When the testing mechanism moves to an upper position between the testing socket and the testing arm, the testing arm moves downward in the vertical direction and presses down the testing mechanism thereby coercing the plurality of testing probes in the testing mechanism to closely abut against the chip-under-test, so that the testing chip inside the testing mechanism can electrically connect to the chip-under-test for forming a test loop.

11 Claims, 14 Drawing Sheets

US 9,250,292 B2

TESTING SYSTEM FOR TESTING SEMICONDUCTOR PACKAGE STACKING CHIPS AND SEMICONDUCTOR AUTOMATIC TESTER THEREOF

The current application claims a foreign priority to the patent application of Taiwan No. 101115834 filed on May 3, 2012.

BACKGROUND OF THE INVENTION

1. Field of the Invention

The present invention relates to a testing system; in particular, the present invention relates to a testing system for testing semiconductor package stacking chips.

2. Description of Related Art

Currently available portable electronic products like smartphones, mobile computing products and various electronic consumer devices all seek higher semiconductor functionalities and performance under the conditions of limited occupation areas and least thickness and weight with the lowest fabrication costs, so certain manufacturers have recognized such trends and devoted efforts specifically on the integration of semiconductor chips, and also developed the formation of stacked multiple package integration by means of chip stacking or die stacking package.

Such a stacked multi-package integration can be generally categorized into two types, respectively referred as package-on-package (PoP) and package-in-package (PiP). More specifically, in terms of the integral structure of PoP, at present, the technology utilized in industry can lay out more than one hundred contacts on a single chip of square centimeter area, which typically comprises a two-layer structure consisting of a first package (top package) and a second package (bottom package), wherein the first package (top package) is stacked on top of the second package (bottom package), with each package surface including more than one hundred micro contacts (solder balls) for solder connection, and the contacts respectively on the first package and the second package are mutually connected by means of precision soldering technologies. So far, the chip-under-test fabricated in this way is still individually inspected all through visual and manual test operations.

In the stack chip package, upon stack integrating the top chip with the bottom chip, it is necessary to perform test processes on final test yield. Therefore, in a conventional stack chip package, it is required to manually place an individual top chip onto an individual bottom chip in stack so as to perform the final test. However, in case that low yields or continuous errors do occur from the test results, it may become difficult to clearly differentiate whether the top chip or the bottom one causes such problems. Seeking other approaches for solution may complicate the entire process, if unable to efficiently identify the problem source.

Consequently, it is desirable to provide a technical solution which enables the use of a correct, error-free top chip as a testing chip, conjunctively with the automatic pick-up and placement as well as categorization for the under-test bottom chip, and electrically connects the testing chip to the under-test bottom chip to perform the test operation; hence, it is possible to automatically categorize the bottom chip before the process of stack chip package thereby more significantly increasing the final test efficiency and also saving manpower costs, thus offering an optimal solution.

SUMMARY OF THE INVENTION

Accordingly, the present invention provides a testing system for testing semiconductor package stacking chips to solve the problem of the prior art.

An embodiment of the invention provides a testing system for testing semiconductor package stacking chips. The testing system comprises a testing socket, a testing arm, and a testing mechanism. The testing socket loads a chip-under-test. The testing arm installed over the testing socket moves in the vertical direction. The testing mechanism, which moves to an upper position over the testing socket and leaves the upper position, comprises a probe testing device. The probe testing device has a testing chip inside and a plurality of testing probes electrically connected to the testing chip. The plurality of testing probes extends toward the testing socket for contacting the chip-under-test loaded on the testing socket. When the testing mechanism moves to the upper position between the testing socket and the testing arm, the testing arm moves downward in the vertical direction and presses down the testing mechanism thereby coercing the plurality of testing probes in the testing mechanism to closely abut against the chip-under-test, so that the testing chip inside the testing mechanism can electrically connect to the chip-under-test for forming a test loop.

Another embodiment of the invention provides a semiconductor automatic tester for testing package stacking chips. The semiconductor automatic tester comprises a testing area, a charging area, a discharging area, a pick-up arm, and a testing mechanism. The testing area configures a test board having a testing socket for loading a chip-under-test. The charging area configures a tray for loading the chip-under-test of waiting the test. The discharging area configures a tray for loading the chip-under-test of completing the test. The pick-up arm moves the chip-under-test loaded on the tray in the charging area, on the tray in the discharging area and on the socket in the testing area. The testing arm located over the testing socket moves in the vertical direction. The testing mechanism, which moves to an upper position over the testing socket and leaves the upper position, comprises a probe testing device having a testing chip inside and a plurality of testing probes electrically connected to the testing chip. The plurality of testing probes extends toward the testing socket for contacting the chip-under-test loaded on the testing socket. When the pick-up arm moves the chip-under-test from the tray in the charging area to the testing area, the testing arm moves the chip-under-test to the testing socket of the test board, and when the testing mechanism moves to the upper position between the testing socket and the testing arm, the testing arm moves downward in the vertical direction and presses down the testing mechanism thereby coercing the plurality of testing probes in the testing mechanism to closely abut against the chip-under-test, so that the testing chip inside the testing mechanism can electrically connect to the chip-under-test for forming a test loop, and then the pick-up arm moves the chip-under-test of completing the test to the tray in the discharging area.

Many other advantages and features of the present invention will be further understood by the following detailed description and the appended drawings.

DETAILED DESCRIPTION OF THE PREFERRED EMBODIMENTS

The aforementioned and other technical contents, aspects and effects in relation with the present invention can be clearly acknowledged through the detailed descriptions concerning the preferred embodiments of the present invention in conjunction with the appended drawings.

Figure 1:
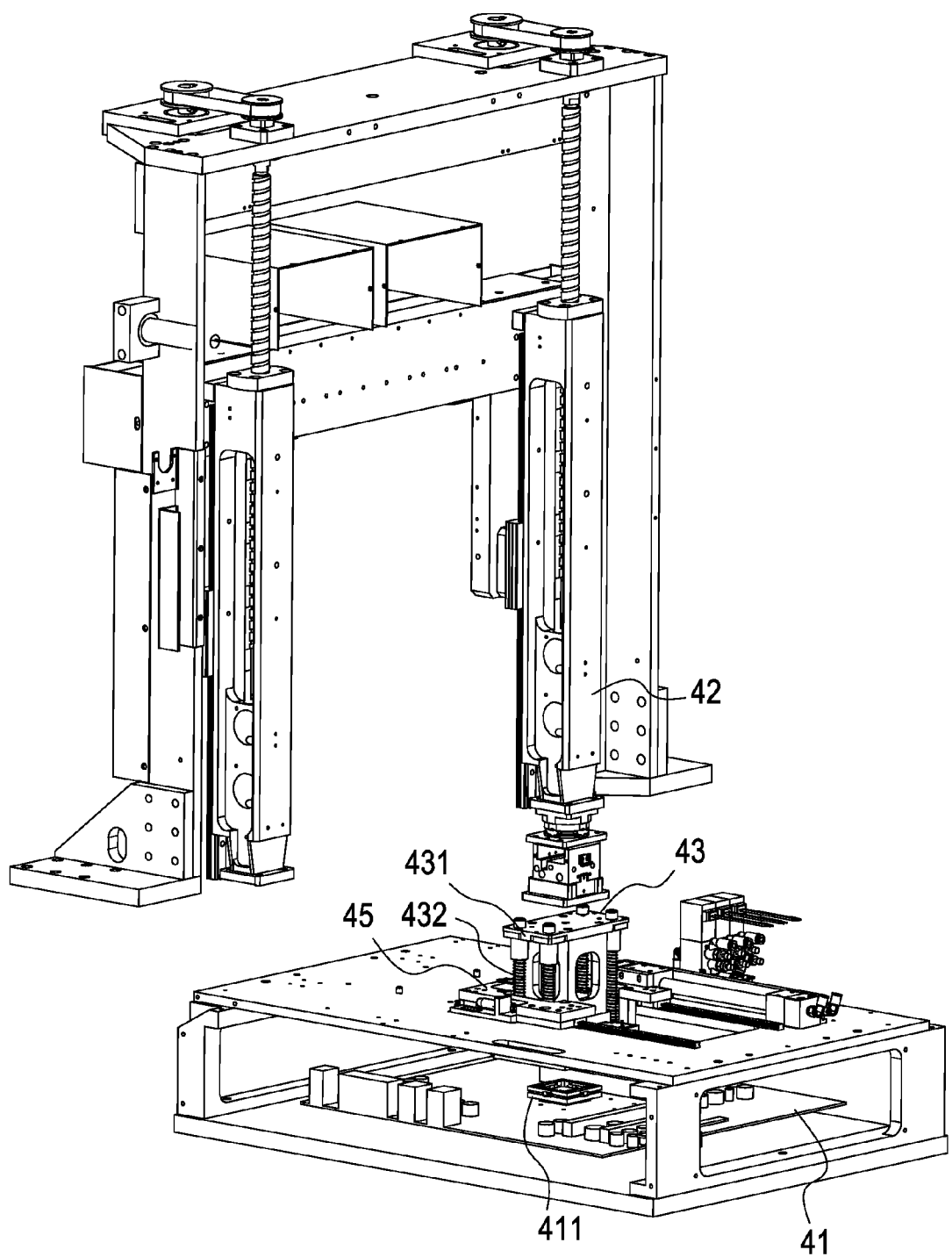
FIG. 1 shows a structural view of the testing system for testing semiconductor package stacking chips and the semiconductor automatic tester thereof according to the present invention.
Figure 2:
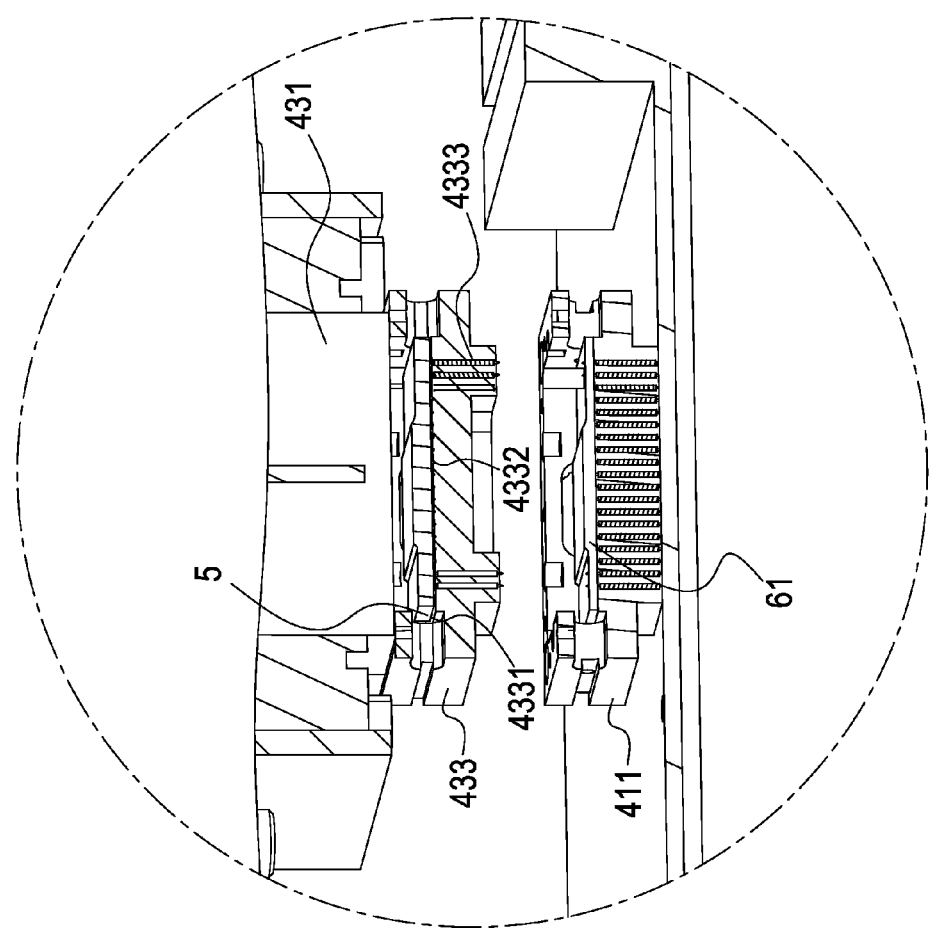
FIG. 2 shows a cross-sectional view of the testing mechanism according to the present invention.

Please refer to FIG. 1 and FIG. 2, illustrating a testing system for testing semiconductor package stacking chips and semiconductor automatic tester thereof according to the present invention. The testing system comprises a testing socket 411 for loading a chip-under-test 61, a set of testing arms 42 installed over the testing socket 411 for moving in the vertical direction, and a testing mechanism 43 for moving to an upper position over the testing socket 411 and leaving the upper position back and forth. The testing mechanism 43 comprises a frame 431, a plurality of elastic elements 432, and a probe testing device 433. The testing socket 411 is installed on a test board 41. In addition, as shown in FIG. 2, the inside of the probe testing device 433 is configured with a load board 4331 and a probe interface 4332. The load board 4331 is used to accommodate a testing chip 5, so that the testing chip 5 can be electrically connected to a plurality of testing probes 4333 extending in the direction toward the testing socket 411. Therefore, one end of the testing probe 4333 is electrically connected to the testing chip 5, and the other end of the testing probe 4333 abuts against the micro electrode contacts of the chip-under-test 61 loaded on the testing socket 411.

In one example of the present preferred embodiment, the testing arm 42 can be driven by the transmission of a screw rod and belt wheel set to enable the vertical movement of the testing socket 411 limited to the position above the testing socket 411, and upon pressing down, the testing mechanism 43 is pushed to coerce the elastic elements 432 thereby causing the testing probe 4333 to descend to a predetermined position. The lower portion of the testing arm 42 can also provide a suction function for the device under test, and those skilled in the art acknowledge that such a function can be achieved by means of well-known suction nozzles, negative pressure or the like.

The plurality of testing probes 4333 configured inside the testing mechanism 43 can be effectively replaced by other means; for example, through a wire or electric conductor with one end thereof being connected to the testing chip 5 and the other end connected in the direction of the chip-under-test 61 in order to form a set of testing contacts for testing the contacted chip-under-test 61, or alternatively a probe of elasticity acting as the conductor for connecting the testing chip 5 and the chip-under-test 61. After all, the objective is the same; i.e., to achieve the formation of a test loop electrically connecting the testing chip 5 and the chip-under-test 61.

This approach for package-on-package (PoP) tests through integral operations of automatic pick and place, test and categorization is so far unseen in relevant industries, and because of the conjunctive disposition of the probe testing device 433 and the testing chip 5 on the testing mechanism 43, in addition to the synchronous movement driven by the vertical downward pressure from the testing arm 42 thereby allowing the micrometer-scaled conductive ends on the chip-under-test to be precisely contacted in alignment by the testing probe 4333, such a temporary conductive connection facilitates the formation of a set of complete test loops so as to accelerate the data transfer rate to 10 GHz and increase the signal stability as well.

The above-said example demonstrates only one set of testing arm 42 and testing socket 411; however, in practice, the tester may be differently configured according to client's demands, in which some of such equipment series can be alternatively installed with four sets or even six sets of testing areas at the same time.

Figure 3A:
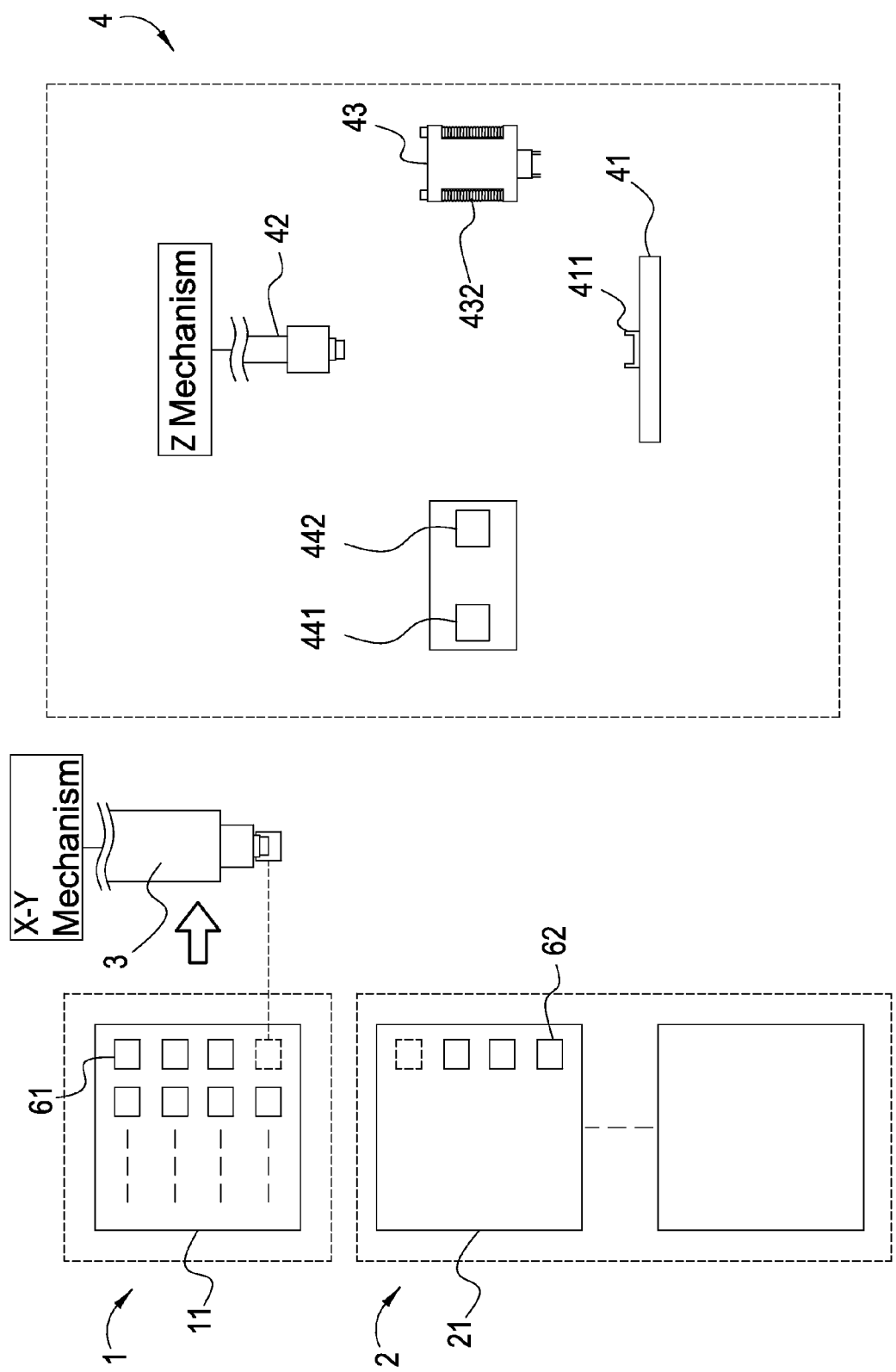
FIG. 3A to FIG. 3J show an operation diagram of the testing system for testing semiconductor package stacking chips and the semiconductor automatic tester thereof according to the present invention.
Figure 3B:
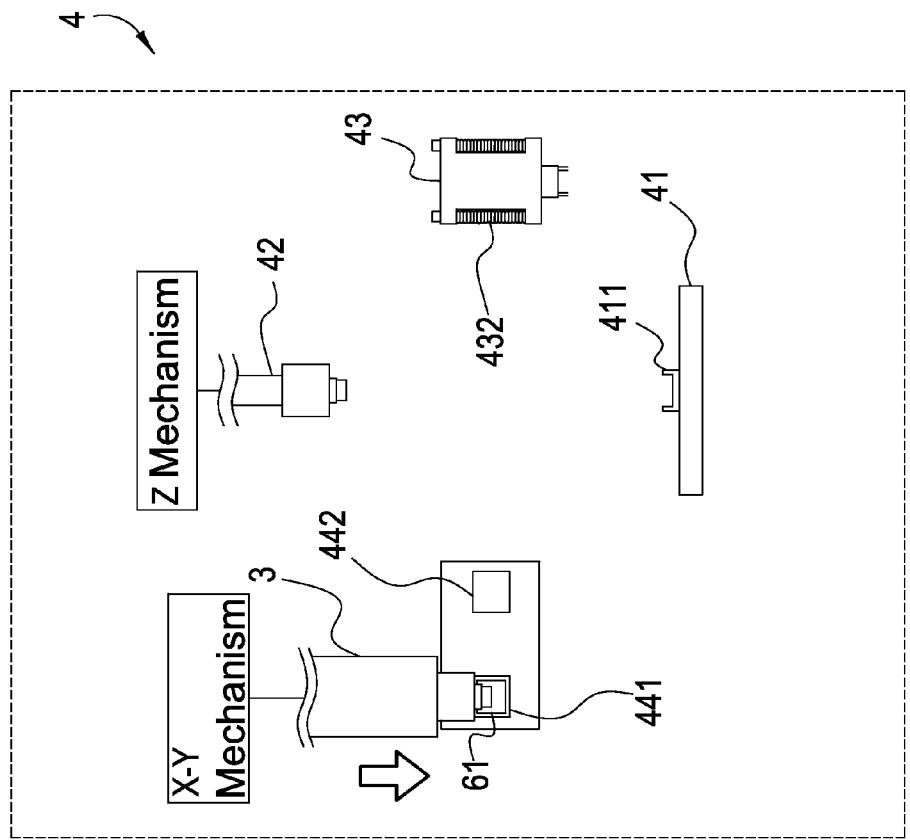
Figure 3B:
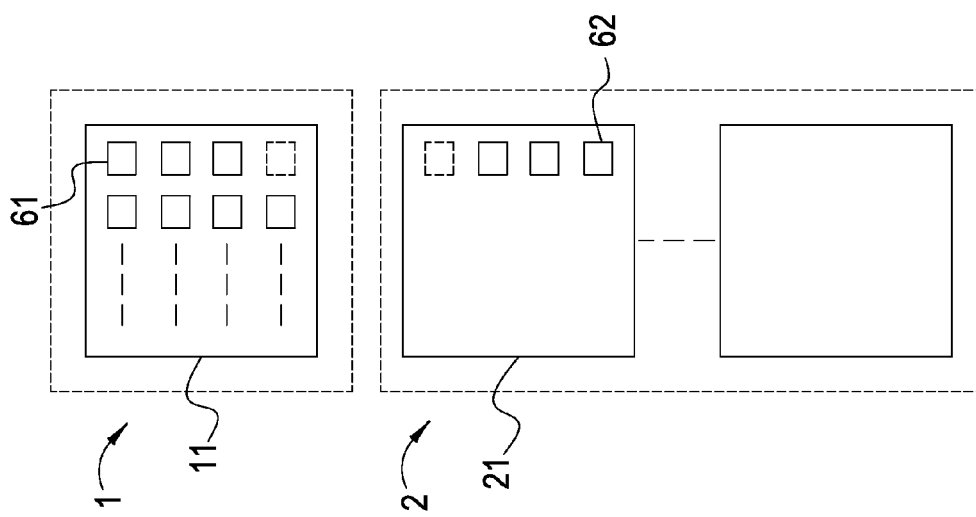
Figure 3C:
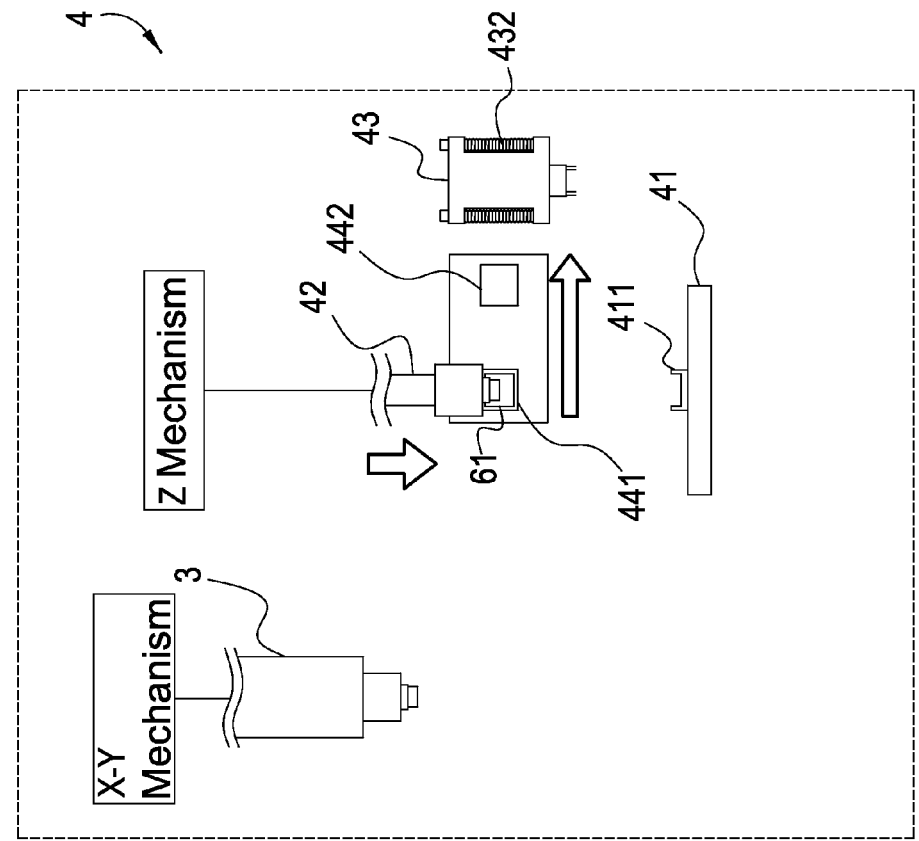
Figure 3C:
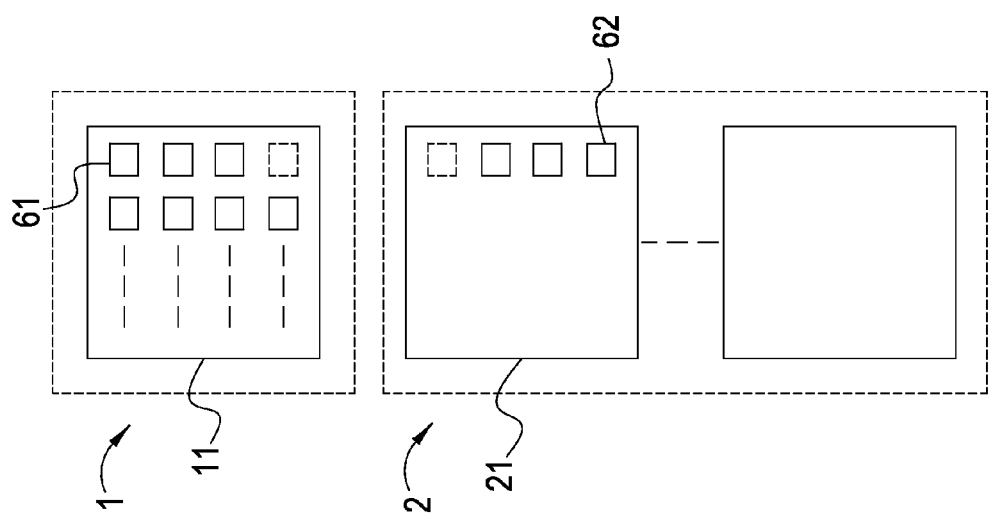
Figure 3D:
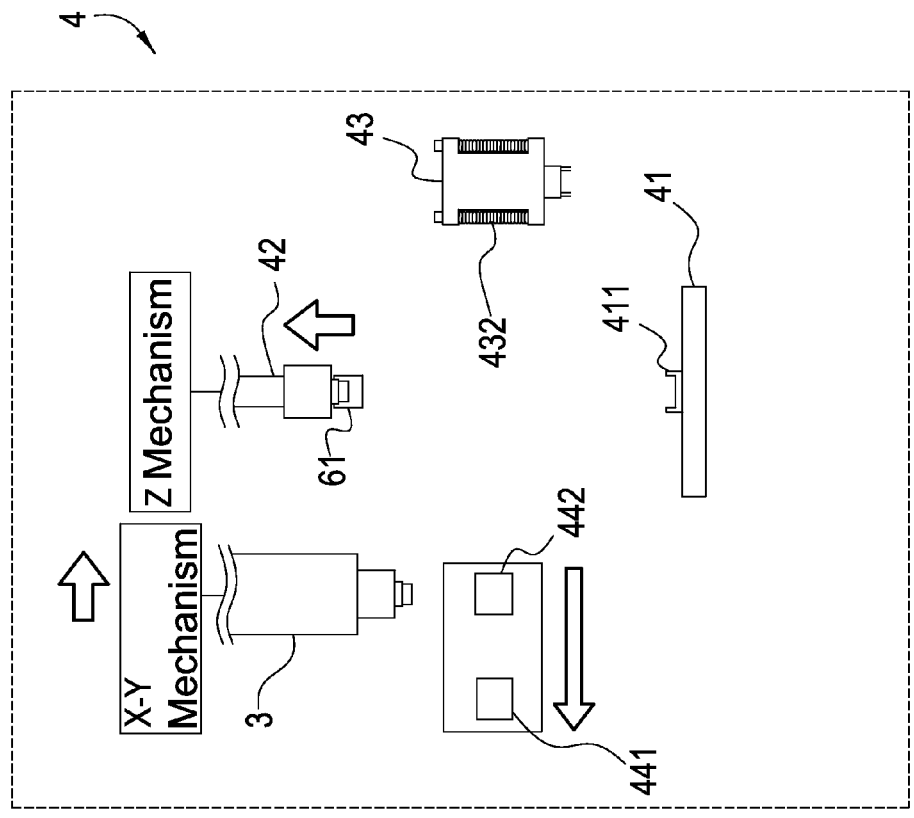
Figure 3D:
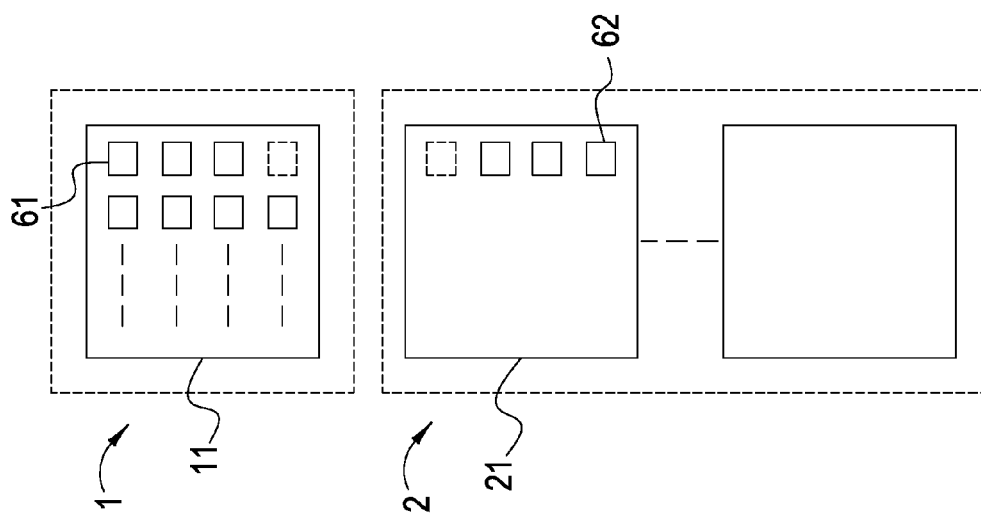
Figure 3E:
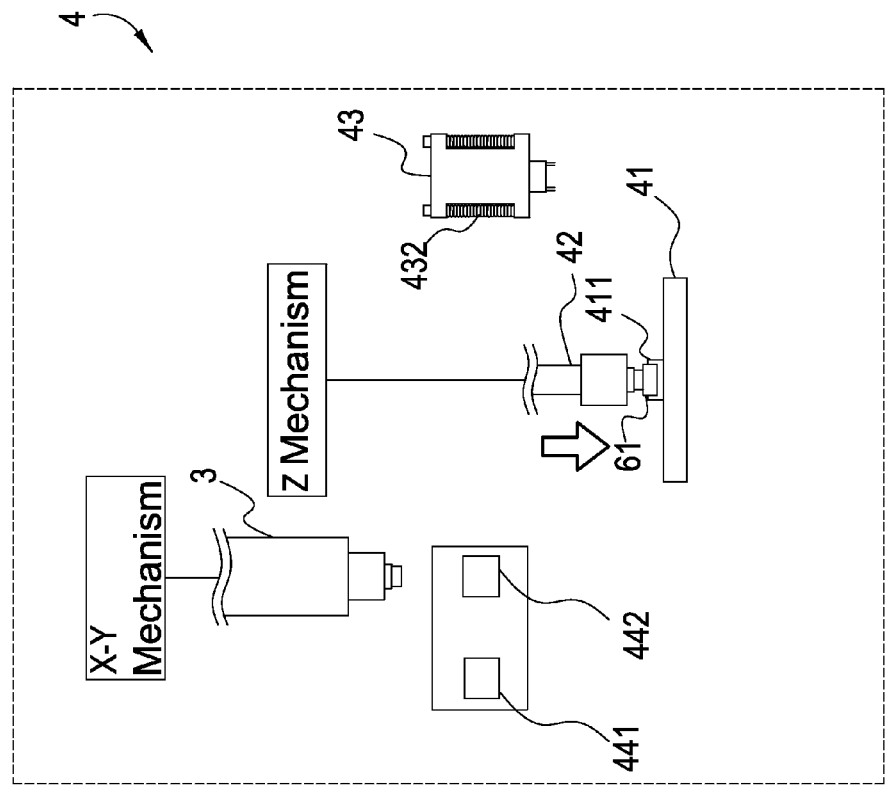
Figure 3E:
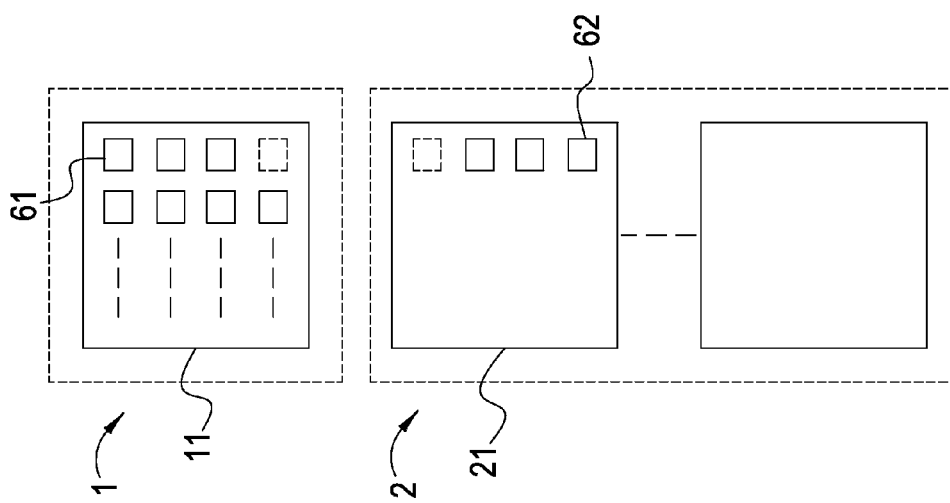

A semiconductor automatic tester according to the present invention is shown in FIG. 3A, further comprising a charging area 1 configuring a tray 11 for loading the chip-under-test 61 of waiting the test, a discharging area 2 configuring tray 21 for loading the chip-under-test 62 of completing the test, and a pick-up arm 3 controlled by means of an X-Y mechanism and used to move the chip-under-test 61 among the tray 11 in the charging area 1, the tray 21 in the discharging area 2 and the testing area 4. During the test operation, as shown in FIG. 3A and FIG. 3B, the pick-up arm 3 controlled by the X-Y mechanism first moves the chip-under-test 61 from the tray 11 in the charging area 1 to the testing area 4. As shown in FIG. 3C and FIG. 3E, the pick-up arm 3 moves the chip-under-test 61 to a load socket 441. Then, the load socket 441 carrying the chip-under-test 61 slides to a position below the testing arm 42; the testing arm 42 transfers the chip-under-test 61 onto the testing socket 411 of the set of test board 41. Those skilled in the art can acknowledge that, when the pick-up arm 3 moves the chip-under-test 61, it is possible to perform adjustments on the process according to client's requirements. For example, the aforementioned load socket 441 may be optional, and for some test equipments, the pick-up arm can dispose the object to be tested directly and precisely onto the testing socket 411.

Figure 3F:
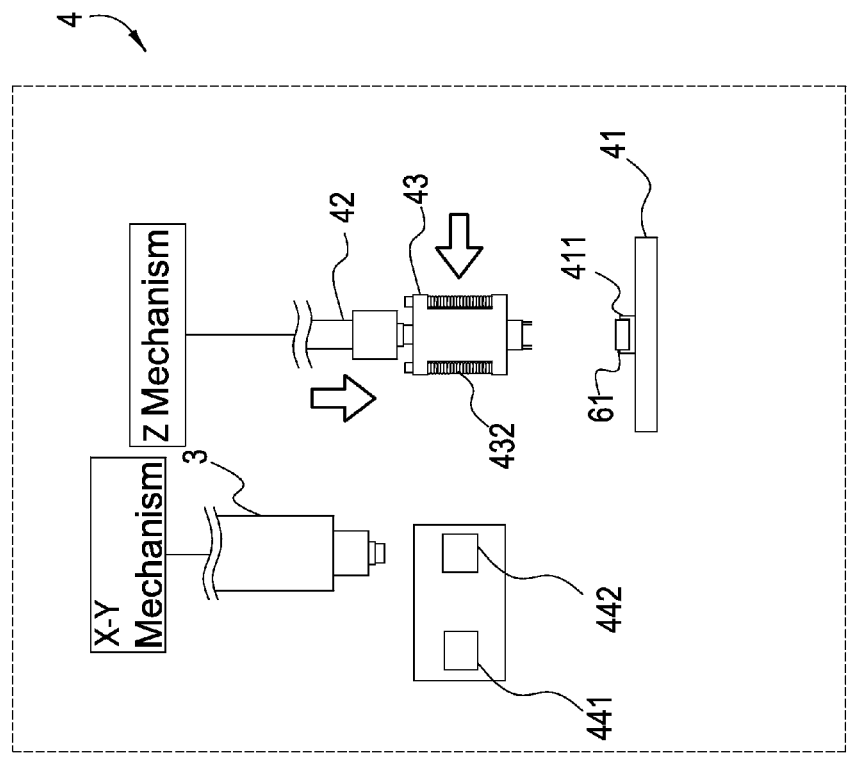
Figure 3F:
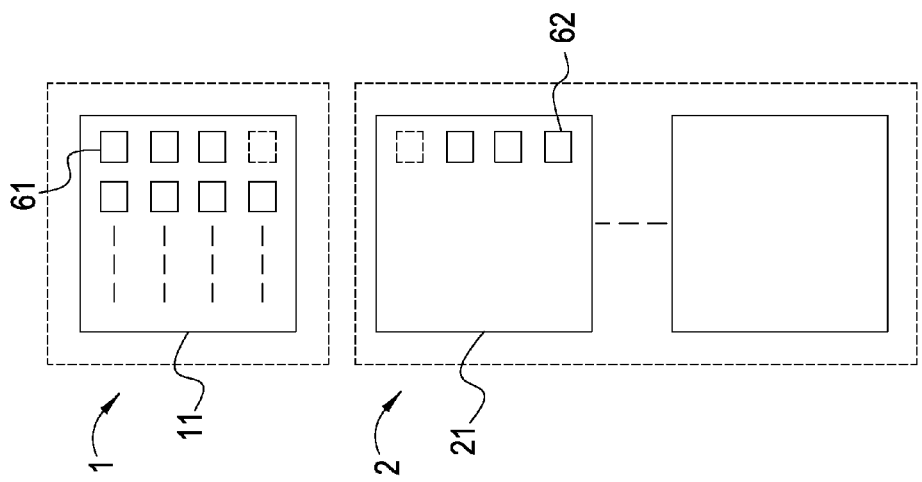
Figure 3G:
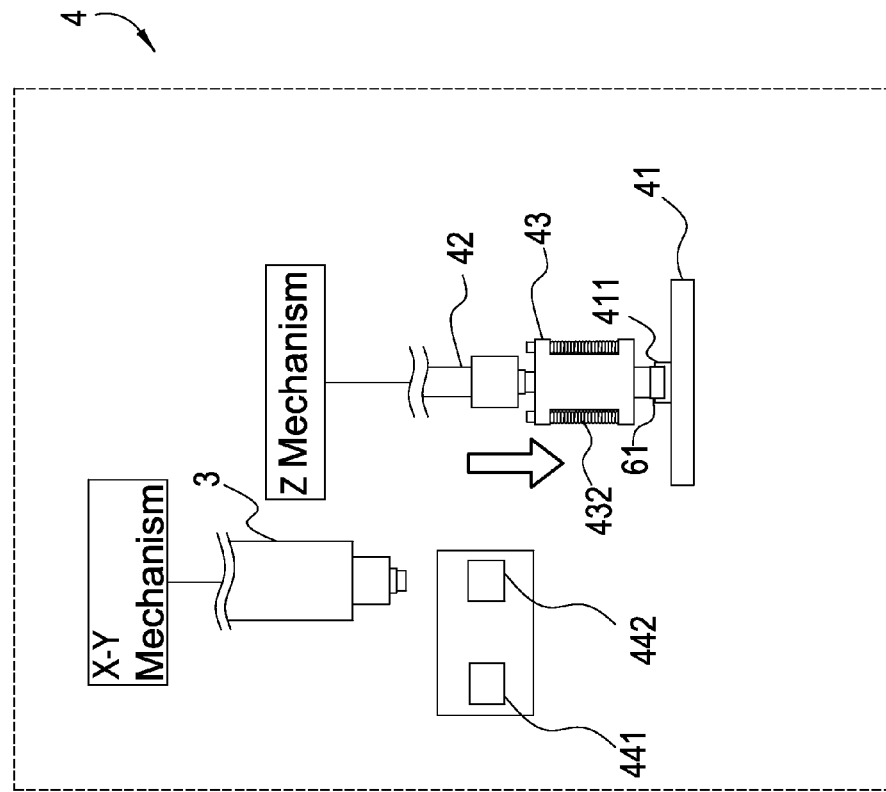
Figure 3G:
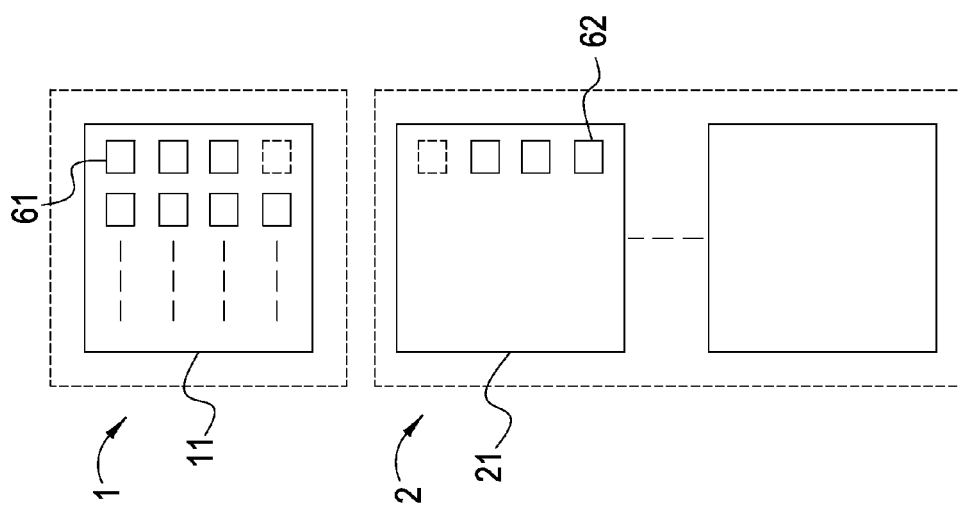

The testing arm 42 restores upward after moving the chip-under-test 61 to the testing socket 411 on the set of test board 41, as shown in FIG. 3F to FIG. 3G; next, through the track 45 (as shown in FIG. 1), the testing mechanism 43 can slide toward or away from the position over the testing socket 411, so that the testing mechanism 43 under control can slide between the position over the testing socket 411 and the testing arm 42 along the track 45. When the testing arm 42 moves downward in the vertical direction once again and presses down the testing mechanism 43, since the elastic elements 432 of the testing mechanism 43 is connected across the probe testing device 433, upon pressing down the testing mechanism 43 by the testing arm 42, the frame 431 will be forced to move downward and drive the entire set of probe testing device 433 to get close to the chip-under-test 61 on the testing socket 411.

Figure 4A:
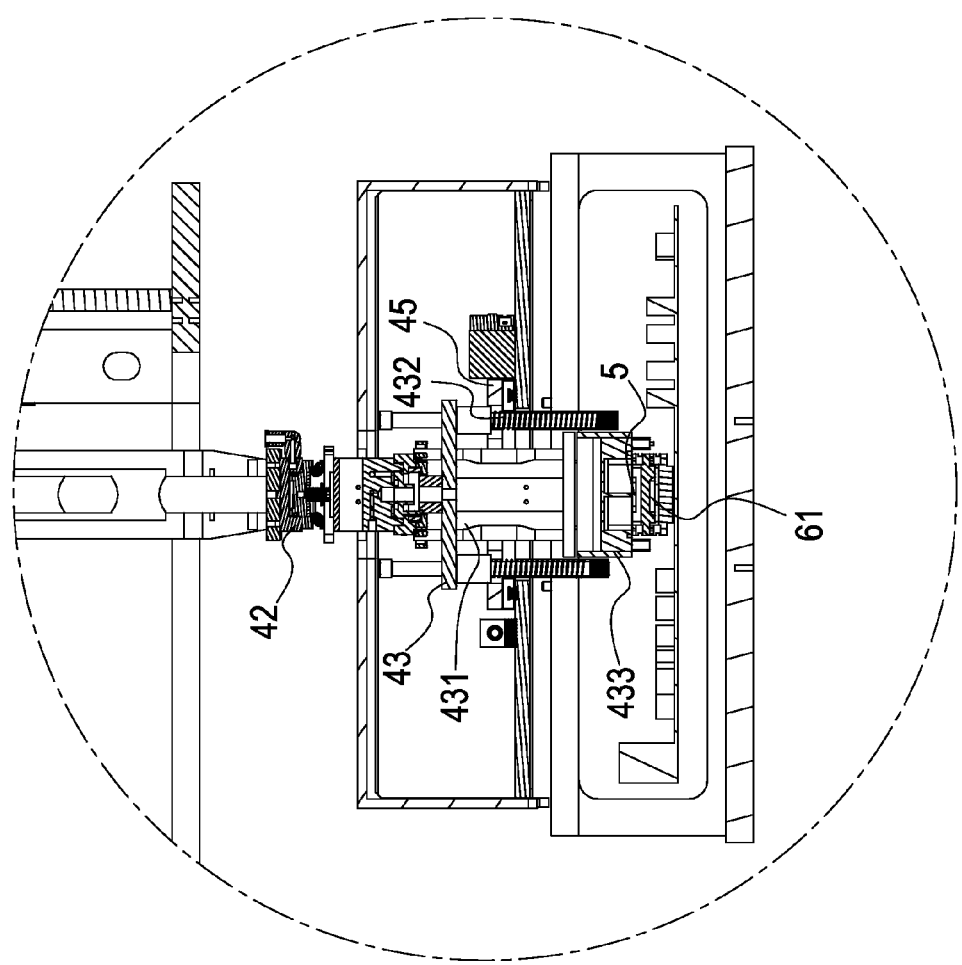
FIG. 4A to FIG. 4B show a cross-sectional view of the testing mechanism moving downward according to the present invention.
Figure 4B:
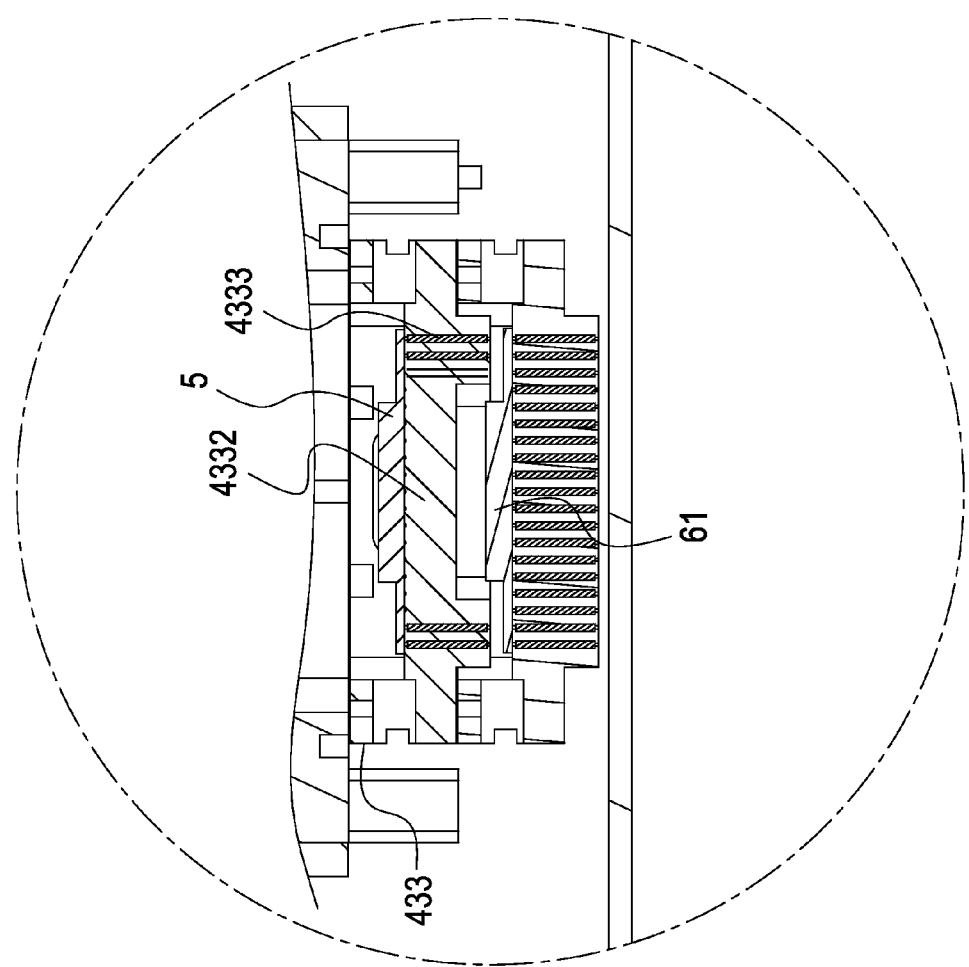

After the plurality of testing probes 4333 of the probe testing device 433 have been coerced to abut against the chip-under-test 61, as shown in FIG. 2, FIG. 4A and FIG. 4B, one end of the testing probe 4333 is electrically connected to the testing chip 5 while the other end is in conductive contact with the chip-under-test 61, so that the testing chip 5 and the chip-under-test 61 together form a stack chip structure, and the electric connection of the testing chip 5 and the chip-under-test 61 inside the testing mechanism 43 along with the test board 41 also constitute a test loop for the test operation. During the test process, each test port in the tester will perform the same move-test steps.

Figure 3H:
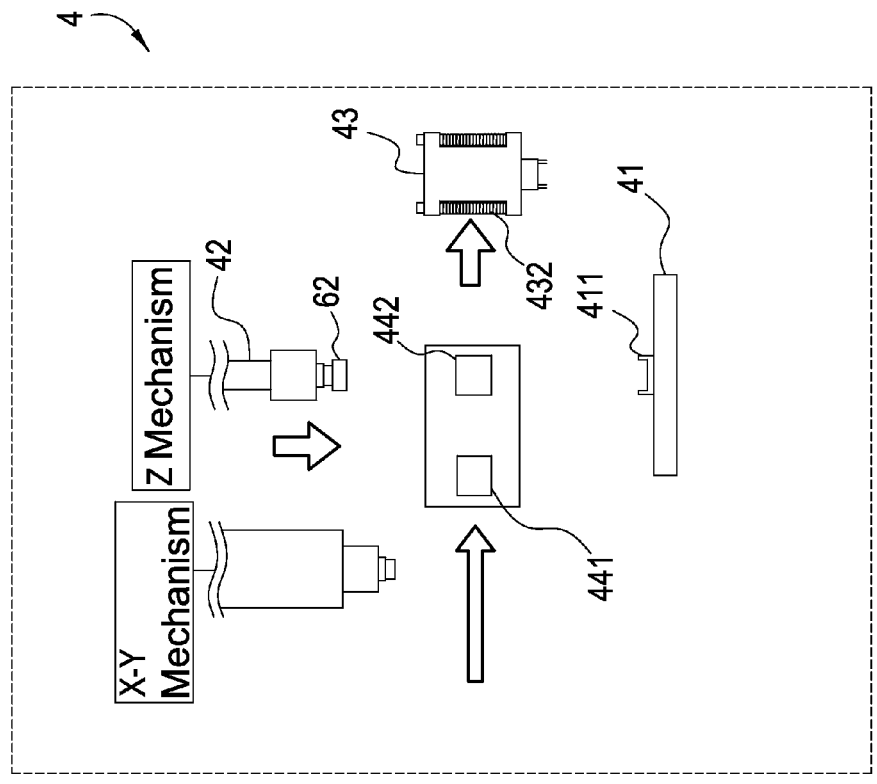
Figure 3H:
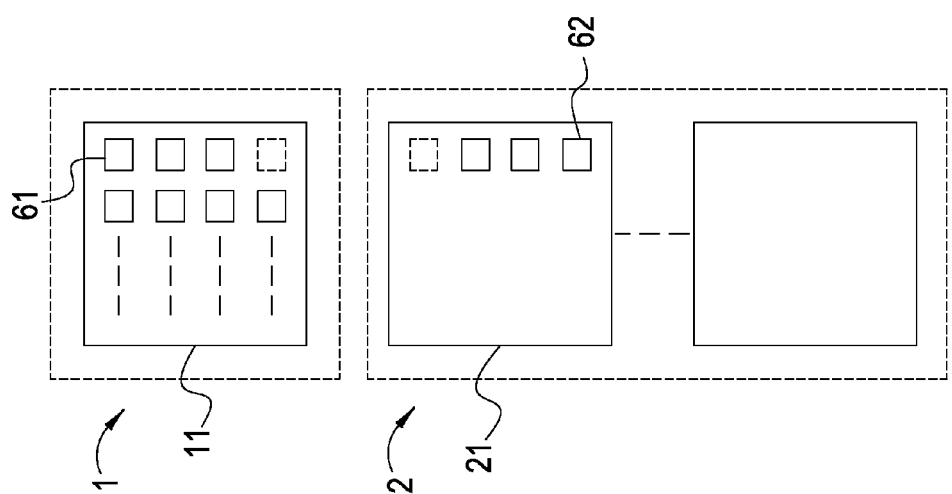
Figure 3I:
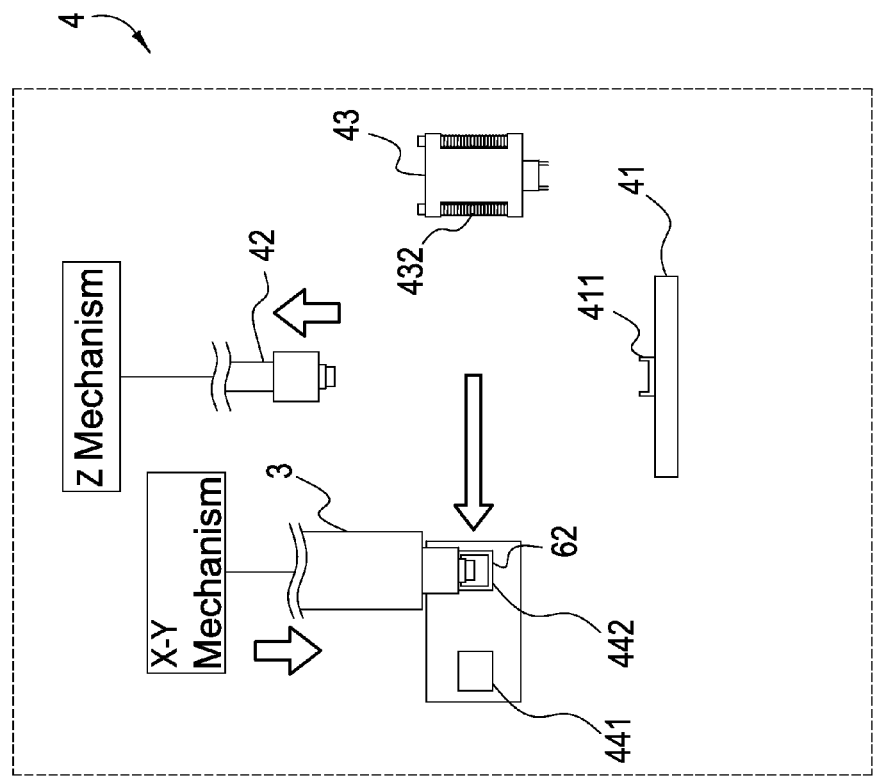
Figure 3I:
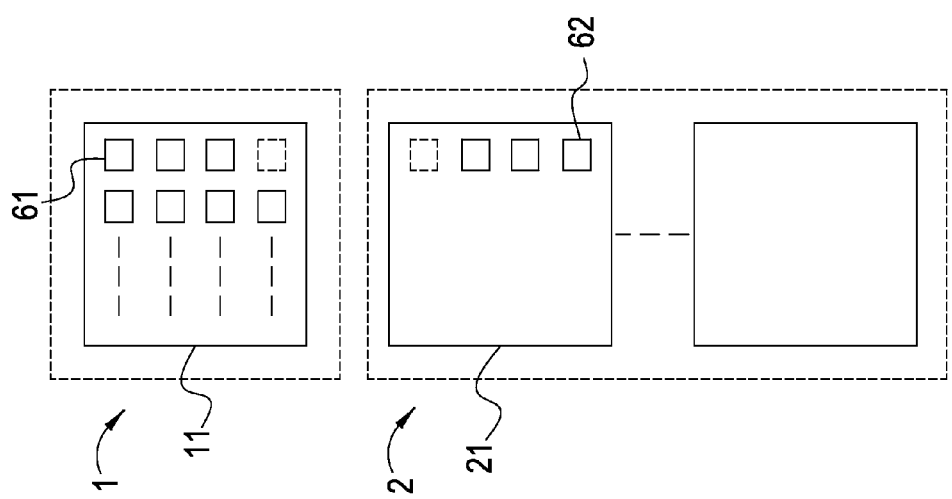
Figure 3J:
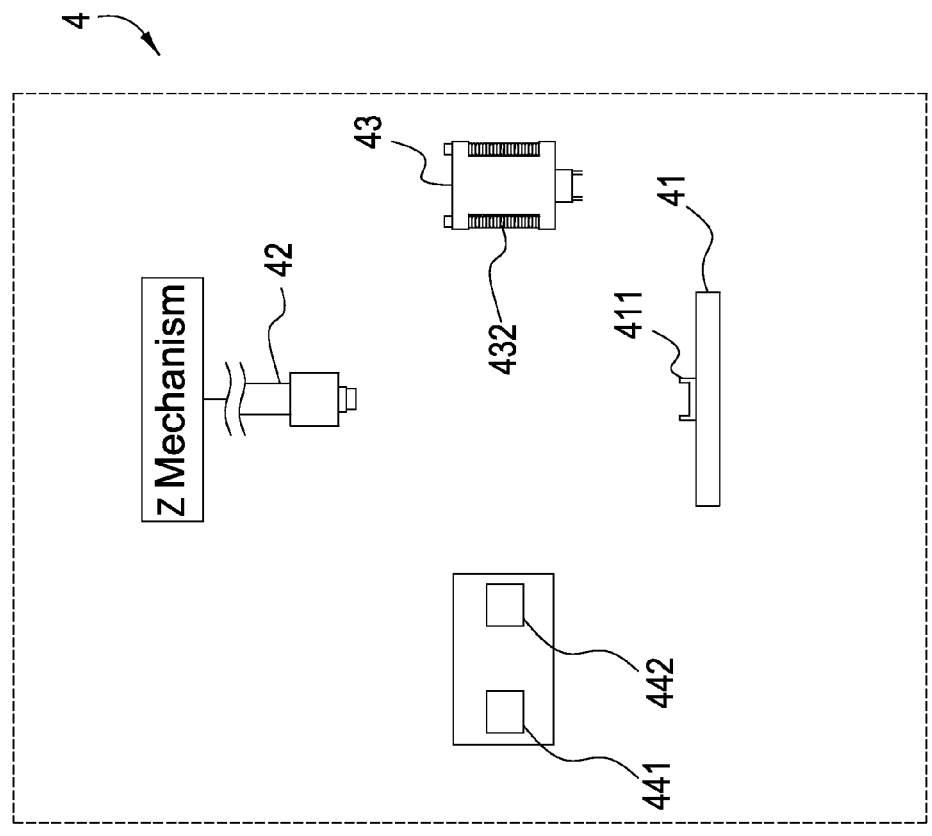
Figure 3J:
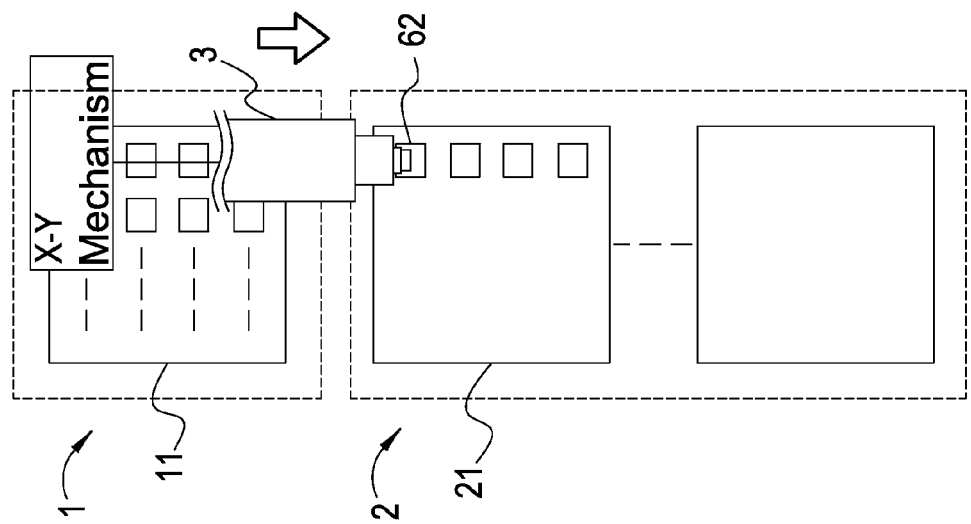

Upon completion of the test operation on the chip-under-test, the testing arm 42 moves upward to leave the testing mechanism 43. The elastic elements 432 in the testing mechanism 43 restore the position of the frame 431 and probe testing device 433. The testing mechanism 43 under control then moves away from the position above the testing socket 411. Finally, the testing arm 42 sucks up the testing chip 62 on the testing socket 411; as shown in FIG. 3H to FIG. 3J, then the load socket 442 moves forward to the position under the testing arm 42 so the testing arm 42 can transfer the testing chip 62 onto the load socket 442, and at last the pick-up arm 3 takes the testing chip 62 away from the testing area 4 and categorizes onto the carrying tray 21 in the discharging area 2. As the testing arm 42 transferring the testing chip 62 to the load socket 442, the load socket 441 also transfers simultaneously the next chip-under-test 61 to continue the execution of the test operation.

Compared with conventional technologies, the testing system for testing semiconductor package stacking chips and semiconductor automatic tester thereof according to the present invention provides the following unique advantages:

1. The present invention discloses an automatic testing system for testing package-on-package (PoP) chips in combination with the pick and place handler as well as the tester thereof.

2. The present invention proposes a testing mechanism capable of moving to an upper position over the testing socket and having a built-in testing chip, in which the testing mechanism presses downward to closely abut against the chip-under-test placed on the testing socket in order to automatically perform semiconductor package stacking chip tests.

3. The present invention can automatically transfer a plurality of semi-PoP chip-under-test to the testing area, and flawed semi-PoP chip-under-test can be previously rejected before the packaging process thereby improving the test efficiency and saving relevant costs.

Through the aforementioned detailed descriptions for the preferred embodiments according to the present invention, it is intended to better illustrate the characteristics and spirit of the present invention rather than restricting the scope of the present invention to the preferred embodiments disclosed in the previous texts. On the contrary, the objective is to encompass all changes and effectively equivalent arrangements within the scope of the present invention as delineated in the following claims of the present application.

What is claimed is:

1. A testing system for testing semiconductor package stacking chips, comprising:
   a testing socket for loading a chip-under-test;
   a testing arm installed over the testing socket, for moving in the vertical direction; and
   a testing mechanism for moving to an upper position over the testing socket and leaving the upper position, the testing mechanism comprising a probe testing device, the probe testing device having a testing chip inside and a plurality of testing probes electrically connected to the testing chip, the plurality of testing probes extending toward the testing socket for contacting the chip-under-test loaded on the testing socket;
   wherein when the testing mechanism moves to the upper position between the testing socket and the testing arm, the testing arm moves downward in the vertical direction and presses down the testing mechanism thereby coercing the plurality of testing probes in the testing mechanism to closely abut against the chip-under-test, so that the testing chip inside the testing mechanism is electrically connected to the chip-under-test for forming a test loop; and
   wherein the testing mechanism is physically unattached to and independent from the testing arm, such that the moving of the testing mechanism to the upper position or leaving the upper position is independent from the moving of the testing arm in the vertical direction.

2. The testing system according to claim 1, wherein the testing mechanism comprises a frame and an elastic element, wherein the elastic element is connected across the probe testing device for restoring the probe testing device after completing the test.

3. The testing system according to claim 1, wherein the testing mechanism moves to the upper position over the testing socket and leaving the upper position back and forth by means of a set of tracks.

4. The testing system according to claim 1, wherein the probe testing device of the testing mechanism further comprises a load board and a probe interface, wherein the testing chip is inserted in the load board and electrically connected to the probe interface.

5. The testing system according to claim 1, wherein when the testing mechanism is at the upper position and the testing arm moves upward in the vertical direction, the testing mechanism is physically separated from the testing arm and is free to leave the upper position.

6. A semiconductor automatic tester for testing package stacking chips, comprising:
   a testing area configuring a test board having a testing socket for loading a chip-under-test;
   a charging area configuring a tray for loading the chip-under-test of waiting the test;
   a discharging area configuring a tray for loading the chip-under-test of completing the test;
   a pick-up arm for moving the chip-under-test loaded on the tray in the charging area, on the tray in the discharging area and on the socket in the testing area;
   a testing arm located over the testing socket for moving in the vertical direction; and
   a testing mechanism for moving to an upper position over the testing socket and leaving the upper position, the testing mechanism comprising a probe testing device having a testing chip inside and a plurality of testing probes electrically connected to the testing chip, the plurality of testing probes extending toward the testing socket for contacting the chip-under-test loaded on the testing socket;
   wherein when the pick-up arm moves the chip-under-test from the tray in the charging area to the testing area, the testing arm moves the chip-under-test to the testing socket of the test board, and when the testing mechanism moves to the upper position between the testing socket and the testing arm, the testing arm moves downward in the vertical direction and presses down the testing mechanism thereby coercing the plurality of testing probes in the testing mechanism to closely abut against the chip-under-test, so that the testing chip inside the testing mechanism is electrically connected to the chip-under-test for forming a test loop, and then the pick-up arm moves the chip-under-test of completing the test to the tray in the discharging area; and
   wherein the testing mechanism is physically unattached to and independent from the testing arm, such that the moving of the testing mechanism to the upper position or leaving the upper position is independent from the moving of the testing arm in the vertical direction, and when the testing mechanism is at the upper position and the testing arm moves upward in the vertical direction, the testing mechanism is physically separated from the testing arm and is free to leave the upper position.

7. The semiconductor automatic tester according to claim 6, further comprising a load socket for loading the chipunder-test, the load socket moving to a lower position under the testing arm and leaving the lower position, so that the testing arm is capable of moving the chip-under-test to the testing socket.

8. The semiconductor automatic tester according to claim 6, wherein the testing mechanism comprises a frame and an elastic element, wherein the elastic element is connected across the probe testing device for restoring the probe testing device after completing the test.

9. The semiconductor automatic tester according to claim 6, wherein the testing mechanism moves to the upper position over the testing socket and leaving the upper position back and forth by means of a set of tracks.

10. The semiconductor automatic tester according to claim 6, wherein the probe testing device of the testing mechanism further comprises a load board and a probe interface, wherein the testing chip is inserted in the load board and electrically connected to the probe interface.

11. The semiconductor automatic tester according to claim 6, wherein when the testing mechanism is at the upper position and the testing arm moves upward in the vertical direction, the testing mechanism is physically separated from the testing arm and is free to leave the upper position.

* * * * *